United States Patent
Moriuchi et al.

(10) Patent No.: US 9,325,298 B2
(45) Date of Patent: Apr. 26, 2016

(54) RECEIVING CIRCUIT

(71) Applicant: SOCIONEXT INC., Yokohama-shi, Kanagawa (JP)

(72) Inventors: Tunehiko Moriuchi, Toyoake (JP); Hiromitsu Osawa, Kasugai (JP)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 14/741,905

(22) Filed: Jun. 17, 2015

(65) Prior Publication Data

US 2016/0028378 A1    Jan. 28, 2016

(30) Foreign Application Priority Data

Jul. 28, 2014   (JP) .................................. 2014-152942

(51) Int. Cl.
*H03K 5/22*       (2006.01)
*H03K 3/012*      (2006.01)
*H03K 5/24*       (2006.01)

(52) U.S. Cl.
CPC ............... *H03K 3/012* (2013.01); *H03K 5/249* (2013.01); *H03K 5/2481* (2013.01)

(58) Field of Classification Search
CPC ... H03K 5/2481; H03K 5/249; H03K 5/2418; H04L 25/0272; H03F 3/45183
USPC ................................... 327/55, 63, 65, 67, 208
See application file for complete search history.

(56) References Cited

U.S. PATENT DOCUMENTS

| 7,064,595 B2 * | 6/2006 | Sharma et al. ................. 327/205 |
| 7,605,613 B2 * | 10/2009 | Huang et al. ................... 326/115 |
| 8,836,737 B2 * | 9/2014 | Moriya et al. ................. 345/694 |
| 2006/0146958 A1 | 7/2006 | Doi |
| 2007/0146063 A1 * | 6/2007 | Nakamoto et al. ............. 327/563 |
| 2012/0119790 A1 * | 5/2012 | Chen ............................... 327/65 |
| 2013/0176156 A1 | 7/2013 | Danjo |

FOREIGN PATENT DOCUMENTS

| JP | 2001-60832 A | 3/2001 |
| JP | 2004-266403 A | 9/2004 |
| JP | 2010-35186 A | 2/2010 |
| JP | 2013-143626 A | 7/2013 |

* cited by examiner

*Primary Examiner* — Quan Tra
(74) *Attorney, Agent, or Firm* — Arent Fox LLP

(57) ABSTRACT

A receiving circuit includes first input transistors of a first conductivity type including control terminals to which differential input signals are applied; load transistors of a second conductivity type connected between a first wiring to which a first voltage is supplied and first terminals of the first input transistors; second input transistors of the second conductivity type including control terminals to which the differential input signals are applied; a latch circuit connected between a second wiring to which a second voltage is supplied and first terminals of the second input transistors; and conversion transistors of the second conductivity type connected in parallel to the second input transistors, the conversion transistors including control terminals that are connected to output nodes to which the first input transistors and the load transistors are connected.

8 Claims, 11 Drawing Sheets

RECEIVING CIRCUIT

CROSS-REFERENCE TO RELATED APPLICATION

This patent application is based upon and claims the benefit of priority of the prior Japanese Patent Application No. 2014-152942 filed on Jul. 28, 2014, the entire contents of which are incorporated herein by reference.

FIELD

The embodiments discussed herein are related to a receiving circuit.

BACKGROUND

Conventionally, electronic devices (for example, semiconductor chips) include a transmitting circuit and a receiving circuit. For example, electronic devices include an auxiliary device (for example, a memory card) that is detachably attached to a system. The electronic devices transmit and receive information of each other by performing, for example, high-speed serial communication using differential signals. The receiving circuit of such an electronic device includes a comparison circuit (comparator) that responds to differential signals (see, for example, Patent Document 1).

FIGS. 10A and 10B illustrate examples of a receiving circuit including a comparison circuit.

In a receiving circuit 201 illustrated in FIG. 10A, differential input signals DLIP, DLIN are input to the gates of the N-channel MOS transistors TN201, TN202, and complementary output signals QOP, QON are output. The receiving circuit 202 illustrated in FIG. 10B includes a pre-amplifier 202a including the N channel MOS transistors TN203, TN204 which receive input of the differential input signals DLIP, DLIN at the respective gates; and a comparison circuit 202b for comparing the output signals VP, VN of the pre-amplifier 202a, and the receiving circuit 202 outputs complementary output signals QOP, QON.

Incidentally, among a plurality of the electronic devices that communicate with each other by differential signals as described above, there are cases where a difference arises in the ground potential. In order to enable communication among the electronic devices having different ground potentials as described above, there is a specification in which the common-mode voltage of the differential signals (the intermediate voltage of the differential signals) is set to be a wide range, for example, 50 mV through 400 mV. It is not possible to use the receiving circuit 201 illustrated in FIG. 10A or the receiving circuit 202 illustrated in FIG. 10B for communication according to such a specification.

With respect to the above problem, one approach is to use a receiving circuit in which an operational amplifier is provided at a stage before the comparison circuit.

For example, a receiving circuit 203 illustrated in FIG. 11 includes a Rail to Rail type operational amplifier 203a and a comparison circuit 203b for comparing the output signals of the operational amplifier 203a. A Rail to Rail type operational amplifier is disclosed in, for example, Patent Document 2. Furthermore, a receiving circuit 204 illustrated in FIG. 12 includes a voltage regulator circuit (Regulator) 204b for regulating the power-supply voltage VDA of an operational amplifier 204a, and a comparison circuit 204c for comparing the output signals of the operational amplifier 204a. These operational amplifiers 203a, 204a receive differential input signals DLIP, DLIN, and generate differential output signals VIP, VIN having an amplitude center that is half the power-supply voltage VDA, with respect to the comparison circuit 204c.

Patent Document 1: Japanese Laid-Open Patent Publication No. 2013-143626

Patent Document 2: Japanese Laid-Open Patent Publication No. 2001-60832

Incidentally, in the receiving circuits 203 and 204 respectively illustrated in FIGS. 11 and 12, the waveform distortion of the differential output signals VIP, VIN respectively supplied to the comparison circuits 203b, 204c, affects the comparison results. As high-speed communication is performed, a wide signal bandwidth is needed in the operational amplifiers 203a, 204a. According to a mutual conductance gm and a capacitance value C, the signal bandwidth GBW is approximated as follows.

$GBW = gm/C$

The relationship between the current Ids of the MOS transistor included in the operational amplifier and the signal bandwidth GBW is expressed as follows.

$$Ids = \frac{\mu Cox}{2} \cdot \frac{W}{L} \cdot (Vgs - Vth)^2 \quad \text{[Formula 1]}$$
$$Veff = (Vgs - Vth)$$
$$gm = \frac{2 \times Ids}{Veff}$$
$$GBW = \frac{gm_1}{C}$$
$$= \frac{2 \times Ids}{Veff \times C}$$

Note that the above formula is an approximation formula. In the above formula, Vgs is the gate-source voltage, Veff is the effective gate voltage, μ is the mobility (carrier mobility), Cox is the gate capacity, W is the gate width, L is the gate length, Vth is the threshold voltage, and Ids is the drain-source current.

Therefore, in order to expand the width of the signal bandwidth GBW, the current Ids flowing to the MOS transistor needs to be increased. Therefore, as described above, the operational amplifiers 203a, 204a, which are respectively provided in a stage before the comparison circuits 203b, 204c, increase the power consumption of the receiving circuits 203, 204, respectively, and eventually increases the power consumption of the corresponding electronic devices.

SUMMARY

According to an aspect of the embodiments, a receiving circuit includes a pair of first input transistors of a first conductivity type respectively including control terminals to which differential input signals are applied; a pair of load transistors of a second conductivity type different from that of the pair of first input transistors, the pair of load transistors respectively being connected between a first wiring to which a first voltage is supplied and first terminals of the pair of first input transistors; a pair of second input transistors of the second conductivity type respectively including control terminals to which the differential input signals are applied; a latch circuit connected between a second wiring to which a second voltage is supplied and first terminals of the pair of second input transistors; and a pair of conversion transistors of the second conductivity type respectively being connected in parallel to the pair of second input transistors, the pair of conversion transistors respectively including control terminals that are respectively connected to a pair of output nodes to which the pair of first input transistors and the pair of load transistors are connected.

The object and advantages of the invention will be realized and attained by means of the elements and combinations particularly pointed out in the appended claims. It is to be understood that both the foregoing general description and the following detailed description are exemplary and explanatory and are not restrictive of the invention as claimed.

DESCRIPTION OF EMBODIMENTS

First Embodiment

In the following, a description is given of a first embodiment.

Figure 2:
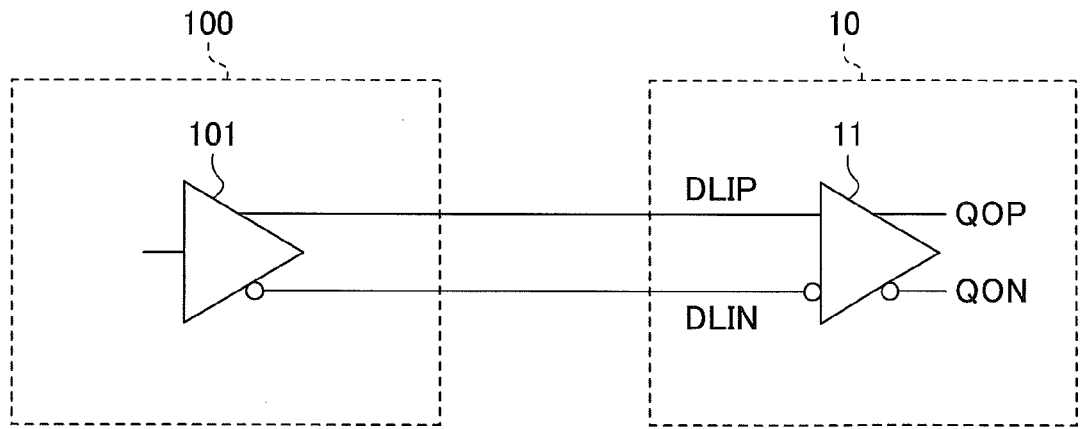
FIG. 2 is a block diagram illustrating connections of an electronic device including the receiving circuit of FIG. 1.

As illustrated in FIG. 2, two electronic devices 10, 100 are communicably connected to each other. The electronic device 10 is, for example, a memory card, and the electronic device 100 is, for example, a digital still camera. The electronic device 100 includes a transmitting circuit 101, and outputs differential signals DLIP, DLIN to the electronic device 10. The electronic device 10 includes a receiving circuit 11. The receiving circuit 11 outputs complementary output signals QOP, QON in response to the differential signals DLIP, DLIN.

Figure 1:
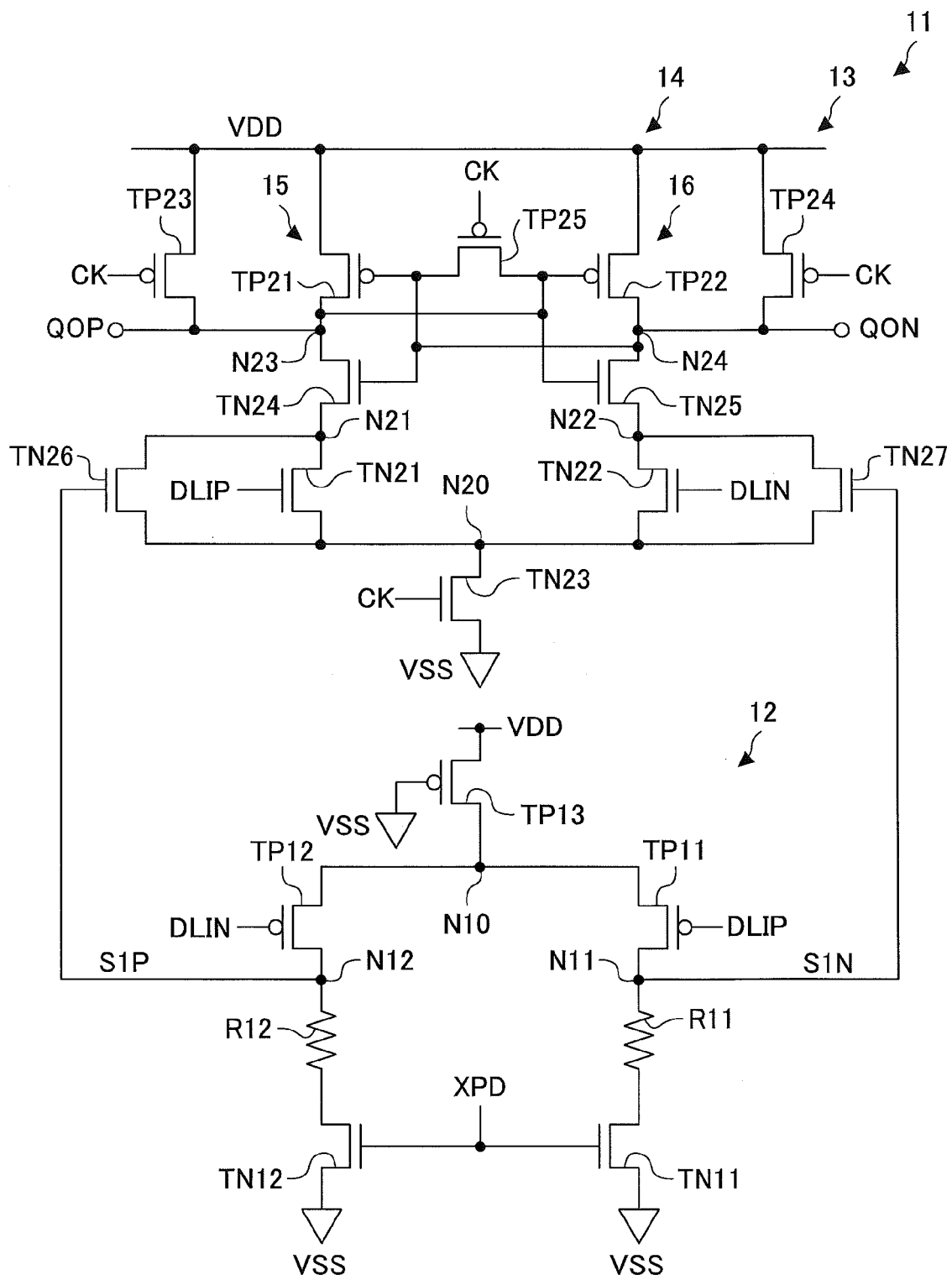
FIG. 1 is a circuit diagram of a receiving circuit according to a first embodiment.

As illustrated in FIG. 1, the receiving circuit 11 includes a first amplifying circuit 12 and a second amplifying circuit 13.

The first amplifying circuit 12 includes a pair of input transistors TP11, TP12 for receiving differential input signals DLIP, DLIN. The input transistors TP11, TP12 according to the present embodiment are, for example, P-channel MOS transistors. The input signals DLIP are applied to a gate terminal (control terminal) of the input transistor TP11, and the input signals DLIN are applied to a gate terminal (control terminal) of the input transistor TP12.

The source terminals (first terminals) of the input transistors TP11, TP12 are connected to each other, and the connection point (node N10) of the source terminals is connected to the drain terminal of a P-channel MOS transistor TP13. The source terminal of the transistor TP13 is connected to a wiring to which a high-potential voltage VDD is supplied (hereinafter, wiring VDD). The gate terminal of the transistor TP13 is connected to a wiring of a low-potential voltage VSS (hereinafter, wiring VSS).

The drain terminals (second terminals) of the input transistors TP11, TP12 are connected to N-channel MOS transistors TN11, TN12 via resistors R11, R12. Specifically, the drain terminal of the input transistor TP11 is connected to the first terminal of the resistor R11, and the second terminal of the resistor R11 is connected to the drain terminal of the transistor TN11. The source terminal of the transistor TP12 is connected to the wiring VSS. The drain terminal of the transistor TN12 is connected to the first terminal of the resistor R12, and the second terminal of the resistor R12 is connected to the drain terminal of the transistor TN12. The source terminal of the transistor TN12 is connected to the wiring VSS. The To the gate terminals of the transistors TN11, TN12, control signals XPD are supplied.

The transistors TN11, TN12 are turned off in response to L-level (for example, low-potential voltage VSS level) control signals XPD, and are turned on in response to H-level (for example, high-potential voltage VDD level) control signals XPD. The control signals XPD are, for example, signals having a level that is logic-inverted from the level of the control signals (power down signals) for reducing the operation voltage (for example, high-potential voltage VDD) of the electronic device 10 illustrated in FIG. 1 to less than a predetermined voltage or for stopping the operation voltage. For example, when the electronic device 10 operates, the H-level control signals XPD are supplied to the transistors TN11, TN12.

A node N11 between the drain terminal of the input transistor TP11 and the resistor R11, and a node N12 between the drain terminal of the input transistor TP12 and the resistor R12, are connected to the second amplifying circuit 13. The first amplifying circuit 12 generates, in the nodes N11, N12, a voltage in response to the potential difference of the differential input signals DLIP, DLIN. Then, the first amplifying circuit 12 outputs differential output signals S1P, S1N of the voltage of these nodes N11, N12.

The second amplifying circuit 13 includes a pair of input transistors TN21, TN22 for receiving the differential input signals DLIP, DLIN. These input transistors TN21, TN22 are MOS transistors that have a different conductivity type from the input transistors TP11, TP12 of the first amplifying circuit 12 described above, and are, for example, N-channel MOS transistors.

The source terminals (first terminals) of the input transistors TN21, TN22 are connected to each other, and the connection point (node N20) between the source terminals is connected to the drain terminal of a N-channel MOS transistor TN23. The source terminal of the transistor TN23 is connected to the wiring VSS, and clock signals CK are supplied to the gate terminal of the transistor TN23. The transistor TN23 is intermittently turned on and off in response to the clock signals CK.

The drain terminals of the input transistors TN21, TN22 are connected to a latch circuit 14.

The latch circuit 14 includes inverter circuits 15, 16. The inverter circuit 15 includes a P-channel MOS transistor TP21 and an N-channel MOS transistor TN24. The source terminal of the transistor TP21 is connected to the wiring VDD, and the drain terminal of the transistor TP21 is connected to the drain terminal of the transistor TN24, and the source terminal of the transistor TN24 is connected to the drain terminal of the input transistor TN21. Therefore, the inverter circuit 15 is connected between the drain terminal of the input transistor TN21 and the wiring VDD.

Similarly, the inverter circuit 16 includes a P-channel MOS transistor TP22 and an N-channel MOS transistor TN25. The source terminal of the transistor TP22 is connected to the wiring VDD, the drain terminal of the transistor TP22 is connected to the drain terminal of the transistor TN25, and the source terminal of the transistor TN25 is connected to the drain terminal of the input transistor TN22. Therefore, the inverter circuit 16 is connected between the drain terminal of the input transistor TN22 and the wiring VDD.

A node N23 between the drain terminal of the transistor TP21 and the drain terminal of the transistor TN24 is the output terminal of the inverter circuit 15, and this node N23 is connected to the gate terminal of the transistor TP22 that is the input terminal of the inverter circuit 16 and the gate terminal of the transistor TN25. Similarly, a node N24 between the drain terminal of the transistor TP22 and the drain terminal of the transistor TN25 is the output terminal of the inverter circuit 16, and this node N24 is connected to the gate terminal of the transistor TP21 that is the input terminal of the inverter circuit 15 and the gate terminal of the transistor TN24.

To the output terminal (node N23) of the inverter circuit 15, the drain terminal of a P-channel MOS transistor TP23 is connected, and the source terminal of the transistor TP23 is connected to the wiring VDD. To the gate terminal of the transistor TP23, clock signals CK are supplied. Similarly, to the output terminal (node N24) of the inverter circuit 16, the drain terminal of a P-channel MOS transistor TP24 is connected, and the source terminal of the transistor TP24 is connected to the wiring VDD. To the gate terminal of the transistor TP24, clock signals CK are supplied. A P-channel MOS transistor TP25 is connected between the input terminals of the inverter circuits 15, 16, and to the gate terminal of the transistor TP25, clock signals CK are supplied. The transistors TP23, TP24, TP25 are turned on and off in a complementary manner with respect to the transistor TN23, based on the clock signals CK.

To the input transistor TN21 described above, an N-channel MOS transistor TN26 is connected in parallel. The source terminal of the transistor TN26 is connected to the source terminal of the input transistor TN21, and the drain terminal of the transistor TN26 is connected to the node N21 between the drain terminal of the input transistor TN21 and the latch circuit 14 (inverter circuit 15). The gate terminal of the transistor TN26 is connected to the node N12 of the first amplifying circuit 12, and output signals S1P are supplied to the gate terminal of the transistor TN26.

Similarly, to the input transistor TN22 described above, an N-channel MOS transistor TN27 is connected in parallel. The source terminal of the transistor TN27 is connected to the source terminal (node N20) of the input transistor TN22, and the drain terminal of the transistor TN27 is connected to the node N22 between the drain terminal of the input transistor TN22 and the latch circuit 14 (inverter circuit 16). The gate terminal of the transistor TN27 is connected to the node N11 of the first amplifying circuit 12, and output signals S1N are supplied to the gate terminal of the transistor TN27.

The second amplifying circuit 13 outputs complementary output signals QOP, QON from the nodes N23, N24.

Next, a description is given of a comparative example.

Figure 3:
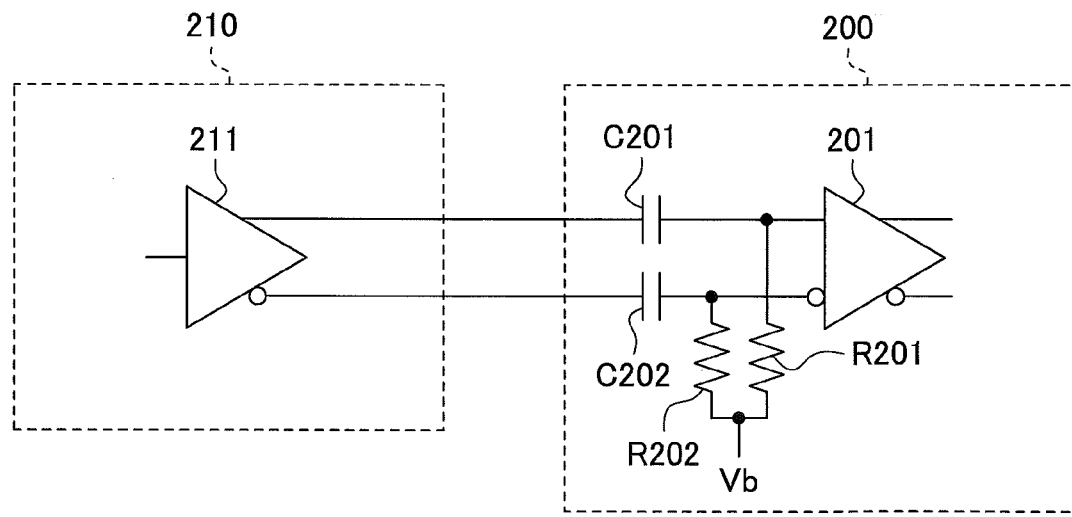
FIG. 3 is a block diagram illustrating a comparative example.
Figure 10B:
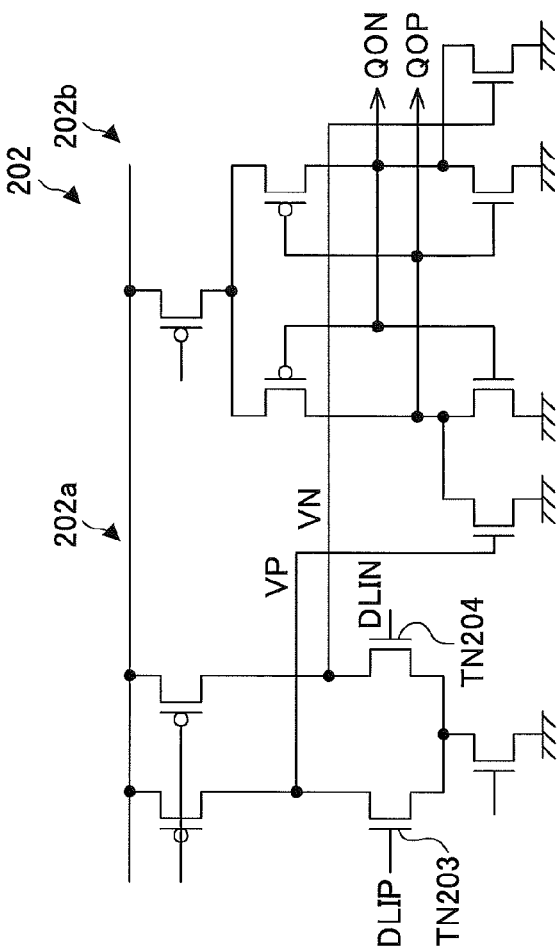
FIGS. 10A and 10B are circuit diagrams of a comparison circuit.
Figure 10A:
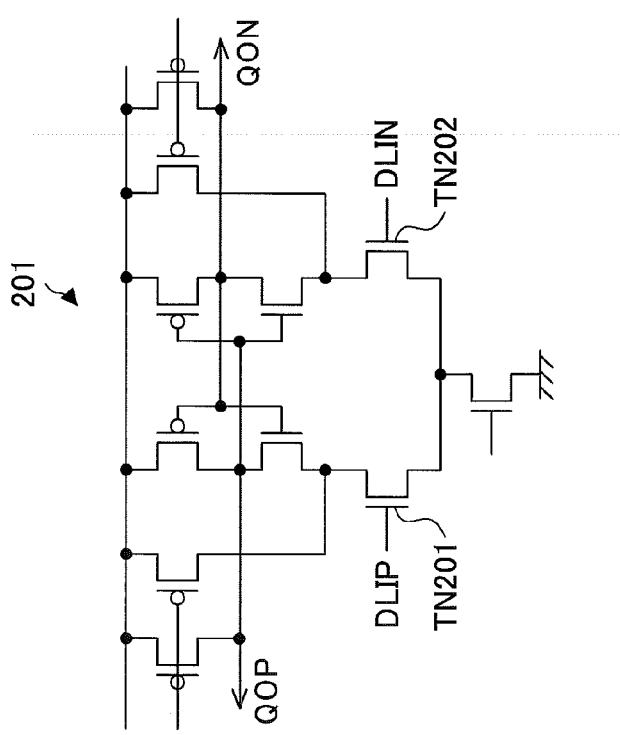
Figure 11:
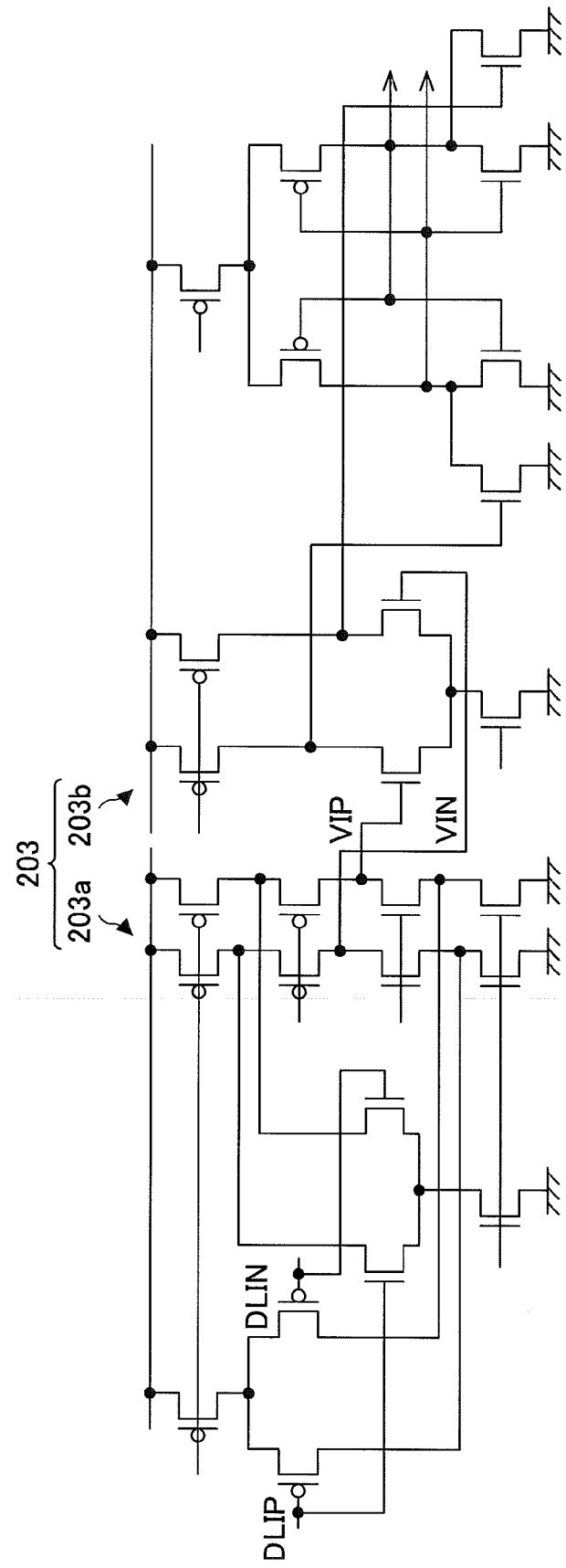
FIG. 11 is a circuit diagram of a receiving circuit.
Figure 12:
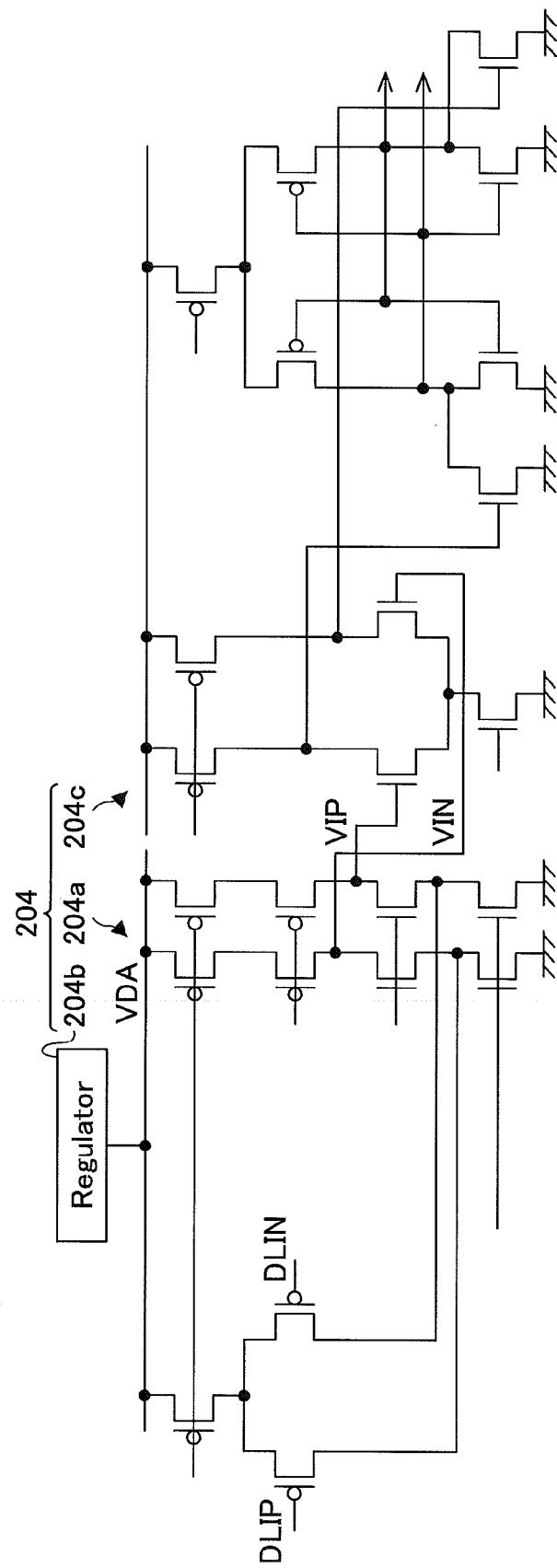
FIG. 12 is a circuit diagram of a receiving circuit.

As illustrated in FIG. 3, two electronic devices 200, 210 are communicably connected to each other. The electronic device 210 includes a transmitting circuit 211, and outputs differential signals DLIP, DLIN to the electronic device 200. The electronic device 200 includes a receiving circuit 201 such as that illustrated in FIG. 10A. The receiving circuit 201 outputs complementary output signals QOP, QON in response to the differential input signals DLIP, DLIN.

The receiving circuit 201 of the electronic device 200, and the transmitting circuit 211 of the electronic device 210 are connected via capacitors C201, C202. The capacitors C201, C202 allow the passage of the alternating-current components (AC components), and remove direct-current components (DC components). That is to say, the receiving circuit 201 is AC coupled with the transmitting circuit 211. Between the two input terminals of the receiving circuit 201, resistors R201, R202 are connected in series, and a bias voltage Vb is supplied to the node between the resistor R201 and the resistor R202. By the bias voltage Vb, the common mode voltage of the receiving circuit 201 is set. The electronic device 200 that performs the above-described communication method (connection method) needs the capacitors C201, C202, the resistors R201, R202, and a circuit for generating the bias voltage Vb. The capacitors C201, C202, etc., increase the size of the electronic device 200.

Furthermore, by the above connection method, appropriate data transition needs to be performed between "0" and "1" according to AC coupling. Therefore, the electronic devices 200, 210 include circuits for performing processes of encoding/decoding such as 8B10B and scrambler/descrambler, etc. Due to the increase in the processing time and data transfer according to these circuits, the effective transfer rate between the electronic device 200 and the electronic device 210 is decreased.

Functions of the receiving circuit 11 according to the present embodiment are described.

The transistor TN24 of the second amplifying circuit 13 is turned on and off in response to clock signals CK. The transistors TP23 through TP25 of the second amplifying circuit 13 are turned on and off in a complementary manner with respect to the transistor TN23, in response to clock signals CK.

When the clock signals CK are L-level, the transistor TN23 is turned off, and the transistors TP23 through TP25 are turned on. The transistors TP23 through TP25, which have been turned on, cause the gate terminals of the transistors TP21, TP22, TN24, TN25 to become H-level, and the transistors TN24, TN25 are turned on. The transistors TP23, TN24, which have been turned on, reset the node N21 to H-level (high-potential voltage VDD level). Similarly, the transistors TP24, TN25, which have been turned on, reset the node N22 to H-level.

When the clock signals CK are H-level, the receiving circuit 11 operates according to the differential input signals DLIP, DLIN. The intermediate voltage (common mode voltage) of the differential input signals DLIP, DLIN is assumed to be Vcm.

1. When common mode voltage Vcm is sufficiently high, and the input transistors TP11, TP12 of the first amplifying circuit 12 are turned off.

At this time, only the second amplifying circuit 13 operates, and the second amplifying circuit 13 operates according to the potential difference of the differential input signals DLIP, DLIN.

When the input signals DLIN are higher than the input signals DLIP (DLIN>DLIP), the transistor TN22 is turned on, and the potential of the node N22 is decreased from the reset potential described above. Then, the potential of the node N24 is decreased. Accordingly, the transistor TN24 is turned off, and the node N23 becomes H-level (high-potential voltage VDD level). The latch circuit 14 maintains this level.

When the input signals DLIN are lower than the input signals DLIP (DLIN<DLIP), the transistor TN21 is turned on, and the potential of the node N21 is decreased from the reset potential described above. Then, the potential of the node N23 is decreased. Accordingly, the transistor TN25 is turned off, and the node N24 becomes H-level (high-potential voltage VDD level). The latch circuit 14 maintains this level.

Therefore, in accordance to the levels (higher or lower) of the differential input signals DLIP, DLIN, the second amplifying circuit 13 changes the potentials of the nodes N21, N22, and causes the node N23 or the node N24 to become H-level. As described above, the receiving circuit 11 compares the levels (higher or lower) of the differential input signals DLIP, DLIN, and maintains (latches) the level according to the comparison result.

2. When common mode voltage Vcm is sufficiently low, and the input transistors TN21, TN22 of the second amplifying circuit 13 turned are off.

When the input signals DLIN are higher than the input signals DLIP (DLIN>DLIP), in the first amplifying circuit 12, the transistor TP11 is turned on, and the transistor TP12 is turned off. Accordingly, the potential of the node N11 becomes higher than the potential of the node N12. Then, in the second amplifying circuit 13, the current flowing through the transistor TN27 becomes higher than the current flowing through the transistor TN26, and the potential of the node N22 decreases. Then, the potential of the node N24 decreases. Accordingly, the transistor TN24 is turned off and the node N23 becomes H-level (high-potential voltage VDD level). The latch circuit 14 maintains this level.

When the input signals DLIN are lower than the input signals DLIP (DLIN<DLIP), in the first amplifying circuit 12, the transistor TP12 is turned on, and the transistor TP11 is turned off. Accordingly, the potential of the node N12 becomes higher than the potential of the node N11. Then, in the second amplifying circuit 13, the current flowing through the transistor TN27 becomes higher than the current flowing through the transistor TN26, and the potential of the node N21 decreases. Then, the potential of the node N23 decreases. Accordingly, the transistor TN25 is turned off and the node N24 becomes H-level (high-potential voltage VDD level). The latch circuit 14 maintains this level.

Therefore, in accordance to the levels (higher or lower) of the differential input signals DLIP, DLIN, the first amplifying circuit 12 changes the potentials of the nodes N21, N22 of the second amplifying circuit 13, and causes the node N23 or the node N24 to become H-level. As described above, the receiving circuit 11 compares the levels of the differential input signals DLIP, DLIN, and maintains (latches) the level according to the comparison result.

3. When common mode voltage Vcm is intermediate level.

When the input signals DLIN are higher than the input signals DLIP (DLIN>DLIP), in the first amplifying circuit 12, the transistor TP11 is turned on, and the transistor TP12 is turned off. Then, in the second amplifying circuit 13, the transistor TN22 is turned on, and the transistor TN21 is turned off. Accordingly, the potential of the node N22 is decreased from the reset potential described above. Then, the potential of the node N24 is decreased. Accordingly, the transistor TN24 is turned off, and the node N23 becomes H-level (high-potential voltage VDD level). The latch circuit 14 maintains this level.

When the input signals DLIN are lower than the input signals DLIP (DLIN<DLIP), in the first amplifying circuit 12, the transistor TP12 is turned on, and the transistor TP11 is turned off. Then, in the second amplifying circuit 13, the transistor TN21 is turned on, and the transistor TN22 is turned off. Accordingly, the potential of the node N21 is decreased from the reset potential described above. Then, the potential of the node N23 is decreased. Accordingly, the transistor TN25 is turned off, and the node N24 becomes H-level (high-potential voltage VDD level). The latch circuit 14 maintains this level.

Therefore, in accordance to the levels (higher or lower) of the differential input signals DLIP, DLIN, the first amplifying circuit 12 and the second amplifying circuit 13 change the potentials of the nodes N21, N22, and cause the node N23 or the node N24 to become H-level. As described above, the receiving circuit 11 compares the levels (higher or lower) of the differential input signals DLIP, DLIN, and maintains (latches) the level according to the comparison result.

Note that in the first amplifying circuit 12, as the voltages of the nodes N11, N12, a gate-source voltage Vgs of the transistors TN26, TN27 of the second amplifying circuit 13 is set. The gate-source voltage Vgs is set to be lower than a threshold voltage Vthn of the transistors TN26, TN27. Accordingly, in the above-described case (1. When common mode voltage Vcm is sufficiently high), the transistors TN26, TN27 are turned off. Furthermore, in the transistors TN26, TN27, the gate-source voltage Vgs is set to be higher than the threshold voltage Vthn (Vgs>Vthn), and the source-drain voltage Vds is set to be higher than the difference between the gate-source voltage Vgs and the threshold voltage Vthn (Vds>Vgs–Vthn). Accordingly, in the above-described case of (2. When common mode voltage Vcm is sufficiently low) or (3. When common mode voltage Vcm is intermediate level), the transistors TN26, TN27 operate in a saturated region. By the above settings, the jitter in the complementary output signals QOP, QON is reduced.

As described above, according to the present embodiment, the following effects are achieved.

(1-1) The first amplifying circuit 12 of the receiving circuit 11 includes a pair of input transistors TP11, TP12 for receiving differential input signals DLIP, DLIN at the gate terminals. The drain terminals of the input transistors TP11, TP12 are connected to the low-potential voltage VSS wiring via the resistors R11, R12 and the transistors TN11, TN12. The second amplifying circuit 13 of the receiving circuit 11 includes a pair of input transistors TN21, TN22 for receiving differential input signals DLIP, DLIN at the gate terminals. The latch circuit 14 is connected between the drain terminals of the input transistors TN21, TN22 and the high-potential voltage VDD wiring (wiring VDD). Furthermore, the transistors TN26, TN27 are connected in parallel to the input transistors TN21, TN22. The gate terminals of the transistors TN26, TN27 are connected to the output nodes N11, N12 between the input transistors TP11, TP12 and the resistors R11, R12 of the first amplifying circuit 12, and differential output signals S1P, S1N are applied to the gate terminals of the transistors TN26, TN27. The transistors TN26, TN27 cause a current to flow according to the voltage of the differential output signals S1P, S1N.

When the differential input signals DLIP, DLIN are sufficiently high, the input transistors TP11, TP12 of the first amplifying circuit 12 are turned off. The receiving circuit 11 uses the input transistors TN21, TN22 of the second amplifying circuit 13 to compare the differential input signals DLIP, DLIN, latches the comparison result with the latch circuit 14, and outputs the complementary output signals QOP, QON. When the differential input signals DLIP, DLIN are at an intermediate level, the receiving circuit 11 compares the differential input signals DLIP, DLIN with the input transistors TP11, TP12 of the first amplifying circuit 12 and the input transistors TN21, TN22 of the second amplifying circuit 13, latches the comparison result with the latch circuit 14, and outputs complementary output signals QOP, QON. When the differential input signals DLIP, DLIN are low, the input transistors TN21, TN22 of the second amplifying circuit 13 are turned off. The receiving circuit 11 uses the input transistors TP11, TP12 of the first amplifying circuit 12 to compare the differential input signals DLIP, DLIN, latches the comparison result with the latch circuit 14, and outputs the complementary output signals QOP, QON.

Therefore, the receiving circuit 11 has a wide range of the common mode voltage Vcm of the differential input signals DLIP, DLIN that are possible to be input. Thus, the receiving circuit 11 is applicable to communication of a specification in which the range of the common mode voltage of differential signals is wide, for example, 50 mV through 400 mV.

(1-2) The receiving circuit 11 has a wide range of the common mode voltage Vcm of the differential input signals DLIP, DLIN that are possible to be input. Thus, the receiving circuit 11 does not need an operational amplifier at a previous stage as indicated in the conventional example, and therefore the power consumption is reduced.

(1-3) The receiving circuit 11 has a wide range of the common mode voltage Vcm of the differential input signals DLIP, DLIN that are possible to be input. Thus, there is no need for a capacitor for AC coupling, a resistor for setting a common mode voltage, or a circuit for setting a bias voltage. Therefore, it is possible to reduce the size of the electronic device 10 including the receiving circuit 11.

Second Embodiment

In the following, a description is given of a second embodiment.

Figure 4:
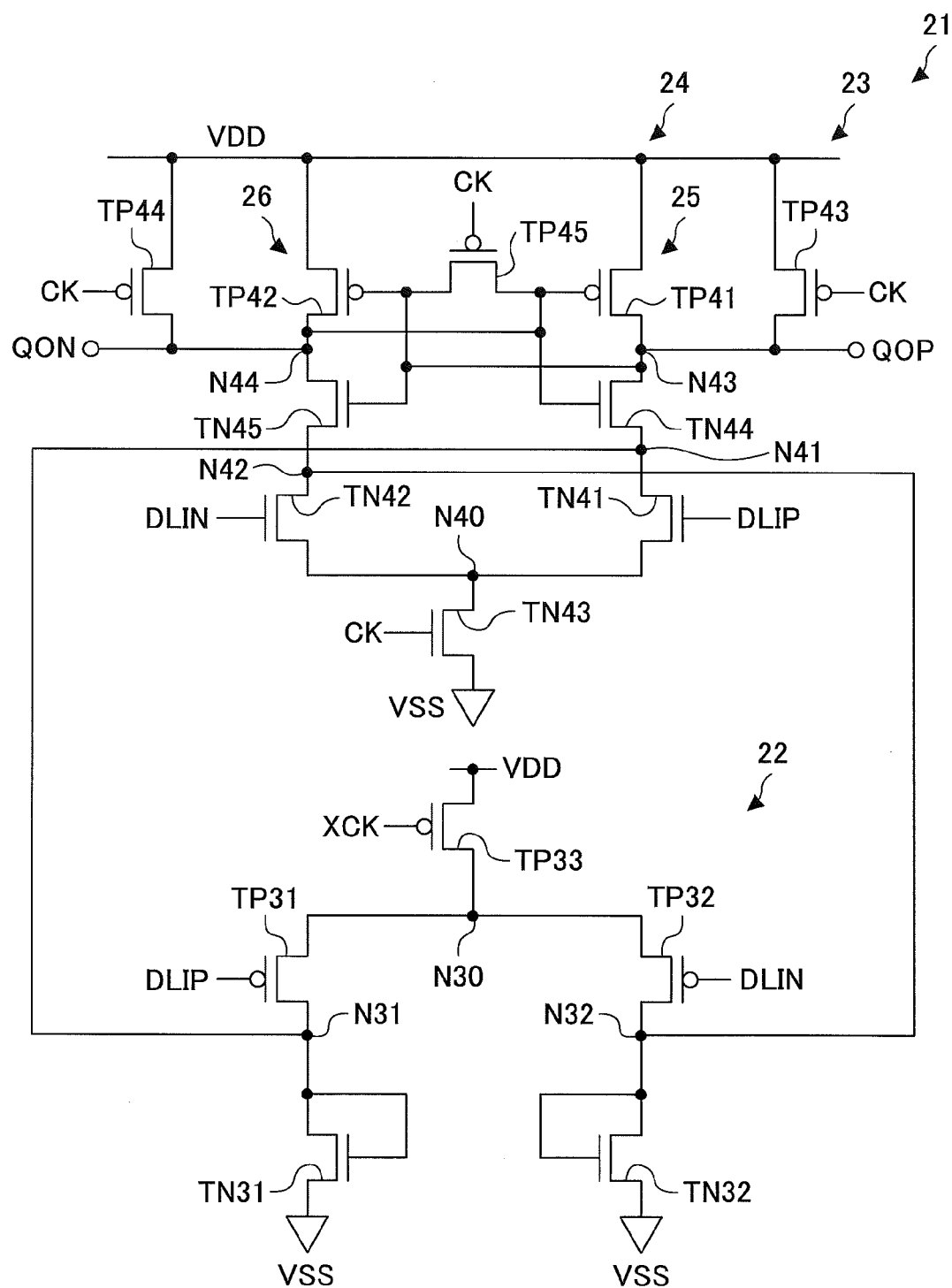
FIG. 4 is a circuit diagram of a receiving circuit according to a second embodiment.

As illustrated in FIG. 4, a receiving circuit 21 includes a first amplifying circuit 22 and a second amplifying circuit 23.

The first amplifying circuit 22 includes a pair of input transistors TP31, TP32 for receiving differential input signals DLIP, DLIN. The input transistors TP31, TP32 according to the present embodiment are, for example, P-channel MOS transistors. The input signals DLIP are applied to a gate terminal (control terminal) of the input transistor TP31, and the input signals DLIN are applied to a gate terminal (control terminal) of the input transistor TP32.

The source terminals (first terminals) of the input transistors TP31, TP32 are connected to each other, and the connection point (node N30) of the source terminals is connected to the drain terminal of a P-channel MOS transistor TP33. The source terminal of the transistor TP33 is connected to a wiring to which a high-potential voltage VDD is supplied (wiring VDD). To the gate terminal of the transistor TP33, inverted clock signals XCK are supplied. The inverted clock signals XCK are obtained by logic-inverting the clock signals CK described below.

The drain terminals (second terminals) of the input transistors TP31, TP32 are connected to N-channel MOS transistors TN31, TN32. The drain terminal of the input transistor TP31 is connected to the drain terminal of the transistor TN31. The source terminal of the transistor TN31 is connected to a wiring to which a low-potential voltage VSS is supplied (wiring VSS). The gate terminal and the drain terminal of the transistor TN31 are connected to each other. Similarly, the drain terminal of the input transistor TP32 is connected to the drain terminal of the transistor TN32. The source terminal of the transistor TN32 is connected to a wiring VSS. The gate terminal and the drain terminal of the transistor TN32 are connected to each other. A node N31 between the drain terminal of the input transistor TP31 and the drain terminal of the transistor TN31, and a node N32 between the drain terminal of the input transistor TP32 and the drain terminal of the transistor TN32, are connected to the second amplifying circuit 23.

The second amplifying circuit 23 includes a pair of input transistors TN41, TN42 for receiving the differential input signals DLIP, DLIN. These input transistors TN41, TN42 are MOS transistors that have a different conductivity type from the input transistors TP31, TP32 of the first amplifying circuit 22 described above, and are, for example, N-channel MOS transistors.

The source terminals (first terminals) of the input transistors TN41, TN42 are connected to each other, and the connection point (node N40) between the source terminals is connected to the drain terminal of a N-channel MOS transistor TN43. The source terminal of the transistor TN43 is connected to the wiring VSS, and clock signals CK are supplied to the gate terminal of the transistor TN43. The transistor TN43 is intermittently turned on and off in response to the clock signals CK.

The drain terminals of the input transistors TN41, TN42 are connected to a latch circuit 24.

The latch circuit 24 includes inverter circuits 25, 26. The inverter circuit 25 includes a P-channel MOS transistor TP41 and an N-channel MOS transistor TN44. The source terminal of the transistor TP41 is connected to the wiring VDD, the drain terminal of the transistor TP41 is connected to the drain terminal of the transistor TN44, and the source terminal of the transistor TN44 is connected to the drain terminal of the input transistor TN41. Therefore, the inverter circuit 25 is connected between the drain terminal of the input transistor TN41 and the wiring VDD. Similarly, the inverter circuit 26 includes a P-channel MOS transistor TP42 and an N-channel MOS transistor TN45. The source terminal of the transistor TP42 is connected to the wiring VDD, the drain terminal of the transistor TP42 is connected to the drain terminal of the transistor TN45, and the source terminal of the transistor TN45 is connected to the drain terminal of the input transistor TN42. Therefore, the inverter circuit 26 is connected between the drain terminal of the input transistor TN42 and the wiring VDD.

A node N43 between the drain terminal of the transistor TP41 and the drain terminal of the transistor TN44 is the output terminal of the inverter circuit 25, and this node N43 is connected to the gate terminal of the transistor TP42 that is the input terminal of the inverter circuit 26 and the gate terminal of the transistor TN45. Similarly, a node N44 between the drain terminal of the transistor TP42 and the drain terminal of the transistor TN45 is the output terminal of the inverter circuit 26, and this node N44 is connected to the gate terminal of the transistor TP41 that is the input terminal of the inverter circuit 25 and the gate terminal of the transistor TN44.

To the output terminal (node N43) of the inverter circuit 25, the drain terminal of a P-channel MOS transistor TP43 is connected, and the source terminal of the transistor TP43 is connected to the wiring VDD. To the gate terminal of the transistor TP43, clock signals CK are supplied. Similarly, to the output terminal (node N44) of the inverter circuit 26, the drain terminal of a P-channel MOS transistor TP44 is connected, and the source terminal of the transistor TP44 is connected to the wiring VDD. To the gate terminal of the transistor TP44, clock signals CK are supplied. A P-channel MOS transistor TP45 is connected between the input terminals of the inverter circuits 25, 26, and to the gate terminal of the transistor TP45, clock signals CK are supplied. The transistors TP43, TP44, TP45 are turned on and off in a complementary manner with respect to the transistor TN43, based on the clock signals CK.

The node N41 between the source terminal of the input transistor TN41 and the latch circuit 24 (inverter circuit 25) is connected to the node N31 of the first amplifying circuit 22. Similarly, the node N42 between the source terminal of the input transistor TN42 and the latch circuit 24 (inverter circuit 26) is connected to the node N32 of the first amplifying circuit 22.

The second amplifying circuit 23 outputs complementary output signals QOP, QON from the nodes N43, N44.

Functions of the receiving circuit 11 according to the present embodiment are described.

The transistor TP33 of the first amplifying circuit 22 is turned on and off in response to inverted clock signals XCK. The transistor TN43 of the second amplifying circuit 23 is turned on and off in response to clock signals CK. The transistors TP43 through TP45 of the second amplifying circuit 23 are turned on and off in a complementary manner with respect to the transistor TN43, in response to clock signals CK.

When the clock signals CK are L-level (the inverted clock signals XCK are H-level), the transistors TP33, TN43 are turned off, and the transistors TP43 through TP45 are turned on. The transistors TP43 through TP45, which have been turned on, cause the gate terminals of the transistors TP41, TP42, TN44, TN45 to become H-level, and the transistors TN44, TN45 are turned on.

Then, a current flows to the transistor TN31 of the first amplifying circuit 22 via the transistors TP43, TN44 which have been turned on. According to this current, the potential of the node N41 of the second amplifying circuit 23 is reset to the voltage (=Vthn+Veff) according to the threshold voltage Vthn and the effective gate voltage Veff of the transistor TN31. Similarly, a current flows to the transistor TN32 of the first amplifying circuit 22 via the transistors TP43, TN45 which have been turned on, and the potential of the node N41 of the second amplifying circuit 23 is reset to (Vthn+Veff).

When the clock signals CK are H-level (the inverted clock signals XCK are L-level), the receiving circuit 21 operates according to the differential input signals DLIP, DLIN. The intermediate voltage (common mode voltage) of the differential input signals DLIP, DLIN is assumed to be Vcm.

1. When common mode voltage Vcm is sufficiently high, and the input transistors TP31, TP32 of the first amplifying circuit 22 are turned off.

At this time, only the second amplifying circuit 23 operates, and the second amplifying circuit 23 operates according to the potential difference of the differential input signals DLIP, DLIN.

When the input signals DLIN are higher than the input signals DLIP (DLIN>DLIP), the transistor TN42 is turned on, and the potential of the node N42 is decreased from the reset potential described above. Then, the potential of the node N44 is decreased. Accordingly, the transistor TN44 is turned off, and the node N43 becomes H-level (high-potential voltage VDD level). The latch circuit 24 maintains this level.

When the input signals DLIN are lower than the input signals DLIP (DLIN<DLIP), the transistor TN41 is turned on, and the potential of the node N41 is decreased from the reset potential described above. Then, the potential of the node N43 is decreased. Accordingly, the transistor TN45 is turned off, and the node N44 becomes H-level (high-potential voltage VDD level). The latch circuit 14 maintains this level.

Therefore, in accordance to the levels (higher or lower) of the differential input signals DLIP, DLIN, the second amplifying circuit 23 changes the potentials of the nodes N41, N42, and causes the nodes N43, node N44 to become H-level. As described above, the receiving circuit 21 compares the levels (higher or lower) of the differential input signals DLIP, DLIN, and maintains (latches) the level according to the comparison result.

2. When common mode voltage Vcm is sufficiently low, and the input transistors TN41, TN42 of the second amplifying circuit 23 are turned off.

When the input signals DLIN are higher than the input signals DLIP (DLIN>DLIP), in the first amplifying circuit 22, the transistor TP31 is turned on, and the transistor TP32 is turned off. Accordingly, the potential of the node N32 becomes low, and a current flows from the node N42 of the second amplifying circuit 23 via the transistor TN32 of the first amplifying circuit 22, and the potential of the node N42 decreases. Then, the potential of the node N44 decreases. Accordingly, the transistor TN44 is turned off and the node N43 becomes H-level (high-potential voltage VDD level). The latch circuit 24 maintains this level.

When the input signals DLIN are lower than the input signals DLIP (DLIN<DLIP), in the first amplifying circuit 22, the transistor TP32 is turned on, and the transistor TP31 is turned off. Accordingly, the potential of the node N31 becomes low, and a current flows from the node N41 of the second amplifying circuit 23 via the transistor TN31 of the first amplifying circuit 22, and the potential of the node N41 decreases. Then, the potential of the node N43 decreases. Accordingly, the transistor TN45 is turned off and the node N44 becomes H-level (high-potential voltage VDD level). The latch circuit 24 maintains this level.

Therefore, in accordance to the levels (higher or lower) of the differential input signals DLIP, DLIN, the first amplifying circuit 22 changes the potentials of the nodes N41, N42 of the second amplifying circuit 23, and causes the nodes N43, N44 to become H-level. As described above, the receiving circuit 21 compares the levels (higher or lower) of the differential input signals DLIP, DLIN, and maintains (latches) the level according to the comparison result.

3. When common mode voltage Vcm is intermediate level.

When the input signals DLIN are higher than the input signals DLIP (DLIN>DLIP), in the first amplifying circuit 22, the transistor TP31 is turned on, and the transistor TP32 is turned off. Then, in the second amplifying circuit 23, the transistor TN42 is turned on, and the transistor TN41 is turned off. Accordingly, the potential of the node N42 is decreased from the reset potential described above. Then, the potential of the node N44 is decreased. Accordingly, the transistor TN44 is turned off, and the node N43 becomes H-level (high-potential voltage VDD level). The latch circuit 24 maintains this level.

When the input signals DLIN are lower than the input signals DLIP (DLIN<DLIP), in the first amplifying circuit 22, the transistor TP32 is turned on, and the transistor TP31 is turned off. Then, in the second amplifying circuit 23, the transistor TN41 is turned on, and the transistor TN42 is turned off. Accordingly, the potential of the node N41 is decreased from the reset potential described above. Then, the potential of the node N43 is decreased. Accordingly, the transistor TN45 is turned off, and the node N44 becomes H-level (high-potential voltage VDD level). The latch circuit 24 maintains this level.

Therefore, in accordance to the levels (higher or lower) of the differential input signals DLIP, DLIN, the first amplifying circuit 22 and the second amplifying circuit 23 change the potentials of the nodes N41, N42, and cause the nodes N43, N44 to become H-level. As described above, the receiving circuit 21 compares the levels (higher or lower) of the differential input signals DLIP, DLIN, and maintains (latches) the level according to the comparison result.

Note that when resetting the latch circuit 24 of the second amplifying circuit 23 based on the L-level clock signals CK, a current flows from the wiring VDD to the wiring VSS via the transistors TP43, TN44, TN31. According to this current, the nodes N41, N42 between the latch circuit 24 and the input transistors TN41, TN42 are reset to a predetermined potential (=Vthn+Veff). Therefore, the threshold voltage of the transistors TN31, TN32 of the first amplifying circuit 22 is set to be lower than the threshold voltage of the transistors of the second amplifying circuit 23 (for example, the input transistors TN41, TN42). That is to say, by setting the transistors TN31, TN32 as low threshold (Low-Vth) transistors, it is possible to lower the high-potential voltage VDD. That is to say, operation becomes possible at a low high-potential voltage VDD.

As described above, according to the present embodiment, the following effects are achieved.

(2-1) The same effects as (1-1) through (1-3) of the first embodiment are achieved.

(2-2) By setting the transistors TN31, TN32 of the first amplifying circuit 22 as low threshold (Low-Vth) transistors, operation becomes possible at a low high-potential voltage VDD.

Modification Examples of Second Embodiment

The second embodiment described above may be implemented by the following modes that have been appropriately changed. In the respective modification examples, the same effects as those of the second embodiment are achieved.

Figure 5:
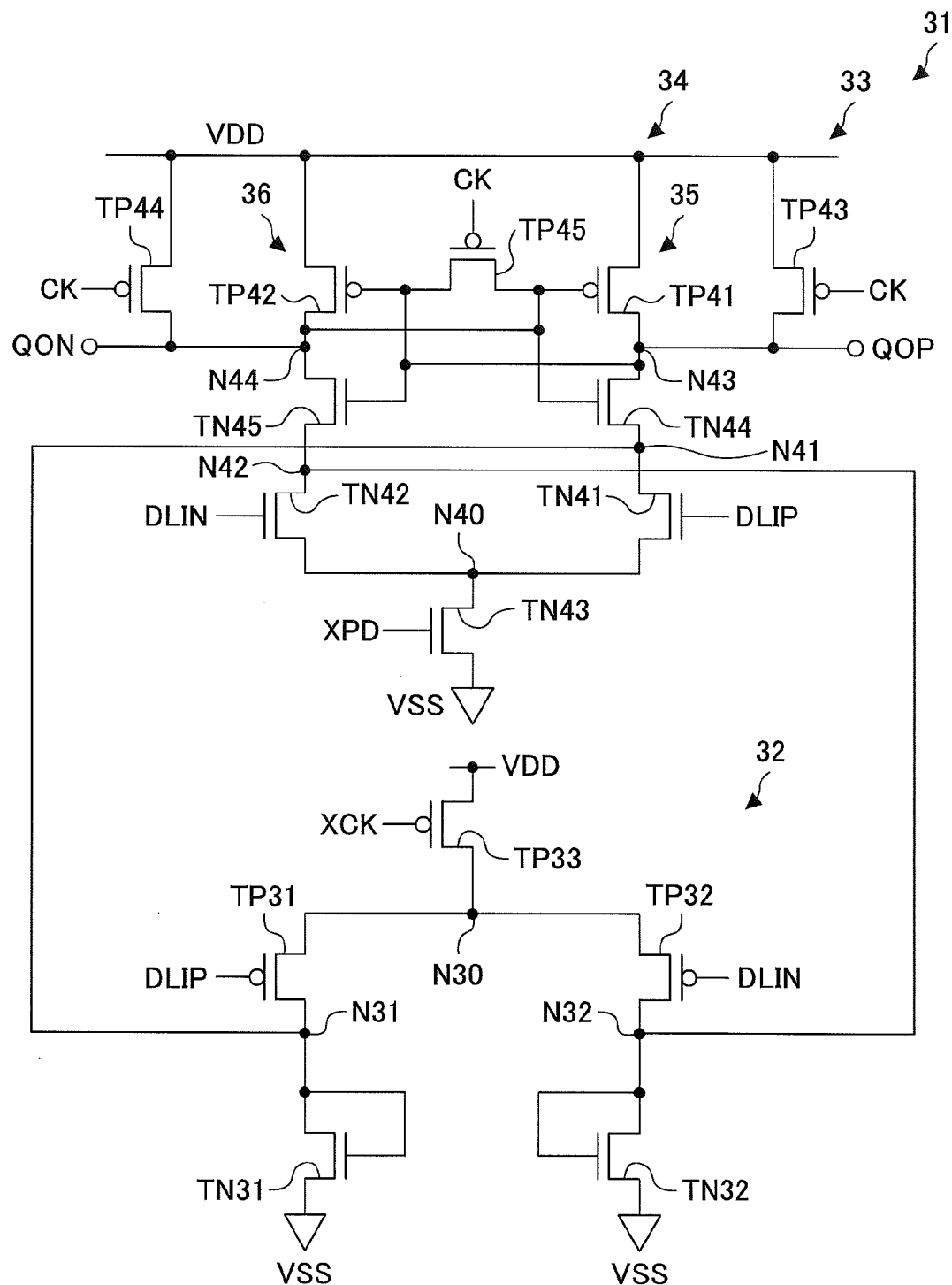
FIG. 5 is a circuit diagram of a modification example of the second embodiment.

A receiving circuit 31 illustrated in FIG. 5 includes a first amplifying circuit 32 and a second amplifying circuit 33. Similar to the first amplifying circuit 22 described above, the first amplifying circuit 32 includes the transistors TP31 through TP33, TN31, TN32. The connections at the respective terminals are the same as those of the first amplifying circuit 22 described above. Similar to the second amplifying circuit 23 described above, the second amplifying circuit 33 includes the transistors TP41 through TP45, TN41 through TN45. Furthermore, similar to the second amplifying circuit 23 described above, the second amplifying circuit 33 includes a latch circuit 34 (inverter circuits 35, 36). Furthermore, in the second amplifying circuit 33, control signals XPD are applied to the gate terminal of the transistor TN43.

Figure 6:
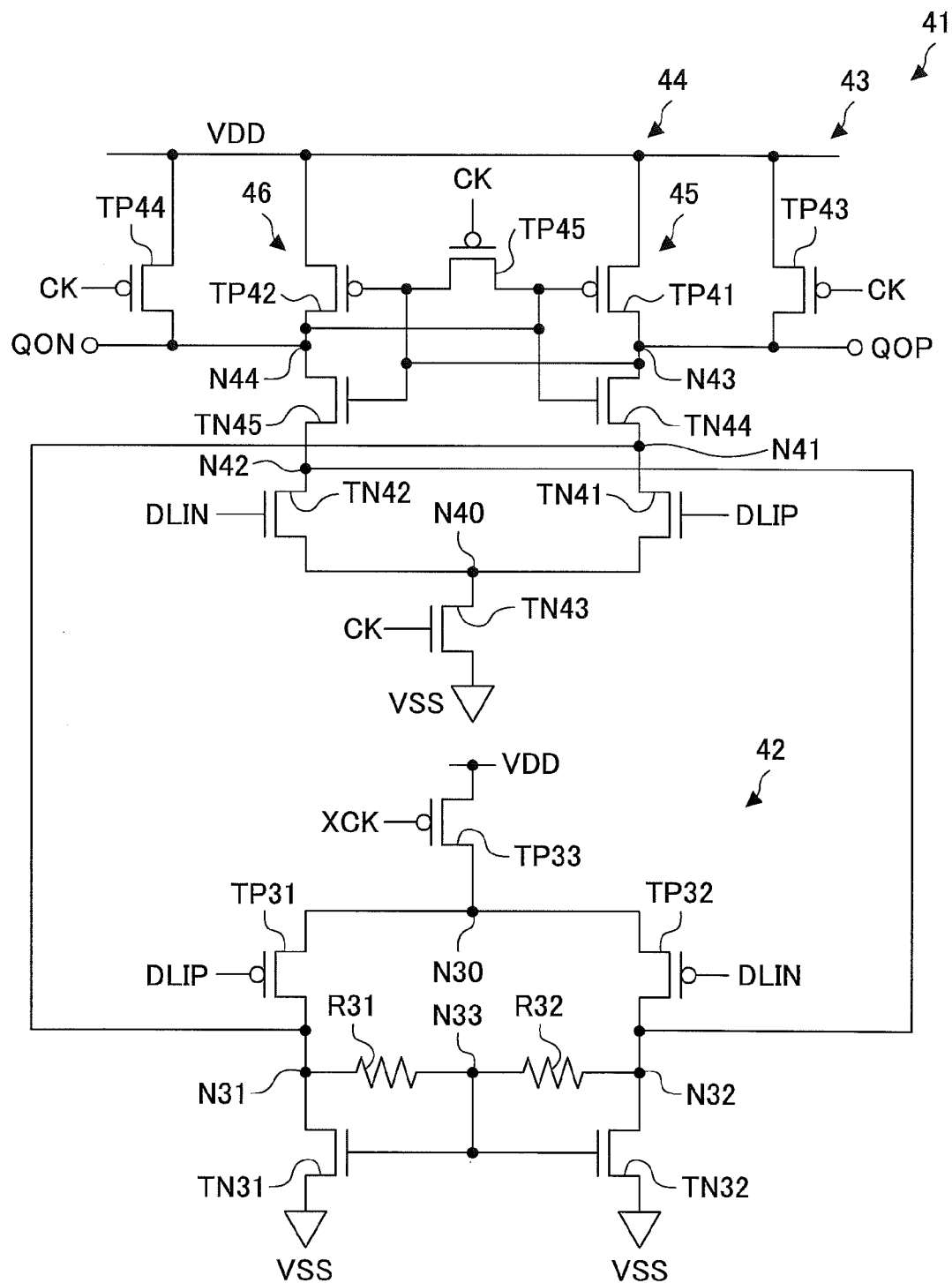
FIG. 6 is a circuit diagram of a modification example of the second embodiment.

A receiving circuit 41 illustrated in FIG. 6 includes a first amplifying circuit 42 and a second amplifying circuit 43. Similar to the first amplifying circuit 22 described above, the first amplifying circuit 42 includes a pair of input transistors TP31, TP32 for receiving differential input signals DLIP, DLIN, and a transistor TP33 having a gate terminal to which control signals XPD are supplied. The drain terminals (second terminals) of the input transistors TP31, TP32 are connected to N-channel MOS transistors TN31, TN32. The drain terminal of the input transistor TP31 is connected to the drain terminal of the transistor TN31. The source terminal of the transistor TN31 is connected to a wiring to which a low-potential voltage VSS is supplied (wiring VSS). Similarly, the drain terminal of the input transistor TP32 is connected to the drain terminal of the transistor TN32. The source terminal of the transistor TN32 is connected to a wiring VSS.

Between the node N31 and the node 32, resistors R31, R32 that are serially connected, are connected. The node N33 between the resistor R31 and the resistor R32 is connected to the gate terminals of the transistors TN31, TN32. These resistors R31, R32 generate, at the node N33, an intermediate potential of the potential of the node N31 and the potential of the node N32 generated by the differential input signals DLIP, DLIN.

Similar to the second amplifying circuit 23 described above, the second amplifying circuit 43 includes the transistors TP41 through TP45, TN41 through TN45. The connections at the respective terminals are the same as those of the second amplifying circuit 23 described above. Therefore, similar to the second amplifying circuit 23 described above, the second amplifying circuit 43 includes a latch circuit 44 (inverter circuits 45, 46).

Figure 7:
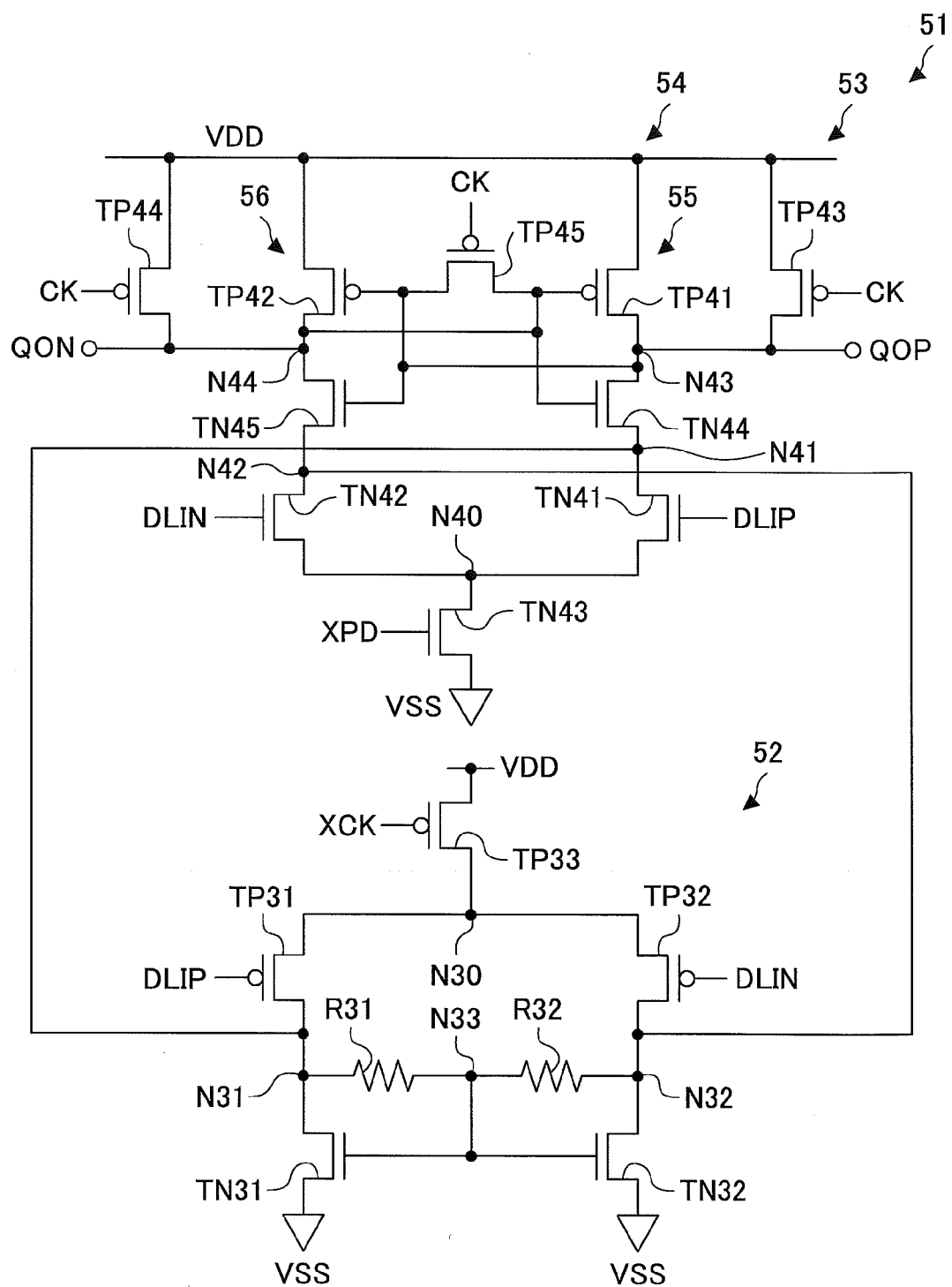
FIG. 7 is a circuit diagram of a modification example of the second embodiment.

A receiving circuit 51 illustrated in FIG. 7 includes a first amplifying circuit 52 and a second amplifying circuit 53. Similar to the first amplifying circuit 42 described above, the first amplifying circuit 52 includes the transistors TP31 through TP33, TN31, TN32. The connections at the respective terminals are the same as those of the first amplifying circuit 42 described above. Similar to the second amplifying circuit 33 described above, the second amplifying circuit 53 includes the transistors TP41 through TP45, TN41 through TN45, and control signals XPD are applied to the gate terminal of the transistor TN43. Furthermore, similar to the second amplifying circuit 33 described above, the second amplifying circuit 53 includes a latch circuit 54 (inverter circuits 55, 56).

Third Embodiment

In the following, a description is given of a third embodiment.

Figure 8:
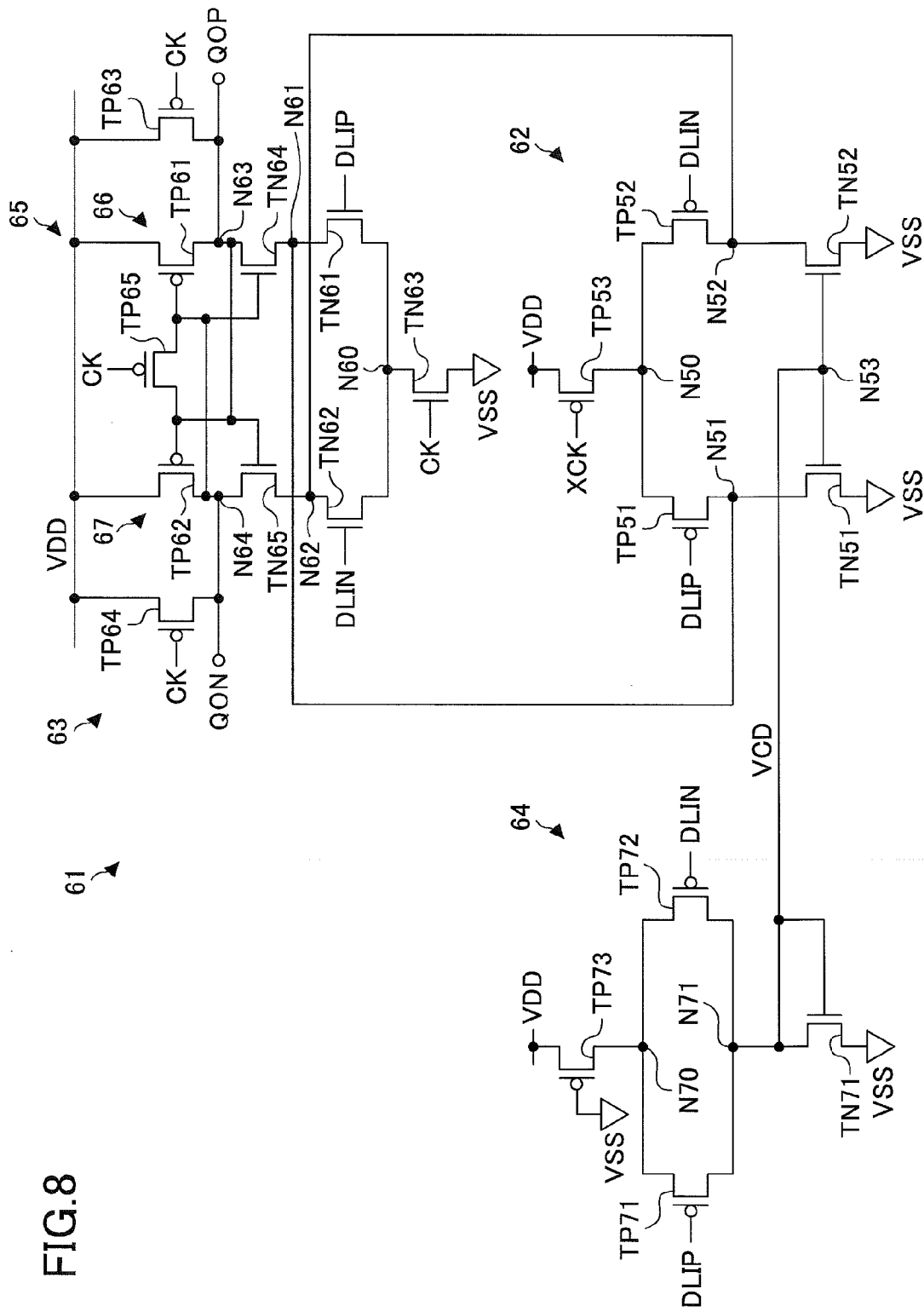
FIG. 8 is a circuit diagram of a receiving circuit according to a third embodiment.

As illustrated in FIG. 8, a receiving circuit 61 includes a first amplifying circuit 62, a second amplifying circuit 63, and a common mode detection circuit 64.

The first amplifying circuit 62 includes a pair of input transistors TP51, TP52 for receiving differential input signals DLIP, DLIN. The input transistors TP51, TP52 according to the present embodiment are, for example, P-channel MOS transistors. The input signals DLIP are applied to a gate terminal (control terminal) of the input transistor TP51, and the input signals DLIN are applied to a gate terminal (control terminal) of the input transistor TP52.

The source terminals (first terminals) of the input transistors TP51, TP52 are connected to each other, and the connection point (node N50) of the source terminals is connected to the drain terminal of a P-channel MOS transistor TP53. The source terminal of the transistor TP53 is connected to a wiring to which a high-potential voltage VDD is supplied (wiring VDD). To the gate terminal of the transistor TP53, inverted clock signals XCK are supplied.

The drain terminals (second terminals) of the input transistors TP51, TP52 are connected to N-channel MOS transistors TN51, TN52. The drain terminal of the input transistor TP51 is connected to the drain terminal of the transistor TN51. The source terminal of the transistor TN51 is connected to a wiring to which a low-potential voltage VSS is supplied (wiring VSS). Similarly, the drain terminal of the input transistor TP52 is connected to the drain terminal of the transistor TN52. The source terminal of the transistor TN52 is connected to a wiring VSS. The gate terminal of the transistor TN51 and the gate terminal of the transistor TN52 are connected to each other, and to the connection point (node N53) of the gate terminals, a detection voltage VCD is supplied from the common mode detection circuit 64.

The node N51 between the drain terminal of the input transistor TP51 and the drain terminal of the transistor TN51, and the node N52 between the drain terminal of the input transistor TP52 and the drain terminal of the transistor TN52, are connected to the second amplifying circuit 63.

The second amplifying circuit 63 includes a pair of input transistors TN61, TN62 for receiving the differential input signals DLIP, DLIN. These input transistors TN61, TN62 are MOS transistors that have a different conductivity type from the input transistors TP51, TP52 of the first amplifying circuit 62 described above, and are, for example, N-channel MOS transistors.

The source terminals (first terminals) of the input transistors TN61, T62 are connected to each other, and the connection point (node N60) between the source terminals is connected to the drain terminal of a N-channel MOS transistor TN63. The source terminal of the transistor TN63 is connected to the wiring VSS, and clock signals CK are supplied to the gate terminal of the transistor TN63. The transistor TN63 is intermittently turned on and off in response to the clock signals CK.

The drain terminals of the input transistors TN61, TN62 are connected to a latch circuit 65.

The latch circuit 65 includes inverter circuits 66, 67. The inverter circuit 66 includes a P-channel MOS transistor TP61 and an N-channel MOS transistor TN64. The source terminal of the transistor TP61 is connected to the wiring VDD, the drain terminal of the transistor TP61 is connected to the drain terminal of the transistor TN64, and the source terminal of the transistor TN64 is connected to the drain terminal of the input transistor TN61. Therefore, the inverter circuit 66 is connected between the drain terminal of the input transistor TN61 and the wiring VDD. Similarly, the inverter circuit 67 includes a P-channel MOS transistor TP62 and an N-channel MOS transistor TN65. The source terminal of the transistor TP62 is connected to the wiring VDD, the drain terminal of the transistor TP62 is connected to the drain terminal of the transistor TN65, and the source terminal of the transistor TN65 is connected to the drain terminal of the input transistor TN62. Therefore, the inverter circuit 67 is connected between the drain terminal of the input transistor TN62 and the wiring VDD.

A node N63 between the drain terminal of the transistor TP61 and the drain terminal of the transistor TN64 is the output terminal of the inverter circuit 66, and this node N63 is connected to the gate terminal of the transistor TP62 that is the input terminal of the inverter circuit 67 and the gate terminal of the transistor TN65. Similarly, a node N64 between the drain terminal of the transistor TP62 and the drain terminal of the transistor TN65 is the output terminal of the inverter circuit 67, and this node N64 is connected to the gate terminal of the transistor TP61 that is the input terminal of the inverter circuit 66 and the gate terminal of the transistor TN64.

To the output terminal (node N63) of the inverter circuit 66, the drain terminal of a P-channel MOS transistor TP63 is connected, and the source terminal of the transistor TP63 is connected to the wiring VDD. To the gate terminal of the transistor TP63, clock signals CK are supplied. Similarly, to the output terminal (node N64) of the inverter circuit 67, the drain terminal of a P-channel MOS transistor TP64 is connected, and the source terminal of the transistor TP64 is connected to the wiring VDD. To the gate terminal of the transistor TP64, clock signals CK are supplied. A P-channel MOS transistor TP65 is connected between the input terminals of the inverter circuits 66, 67, and to the gate terminal of the transistor TP65, clock signals CK are supplied. The transistors TP63, TP64, TP65 are turned on and off in a complementary manner with respect to the transistor TN63, based on the clock signals CK.

The node N61 between the drain terminal of the input transistor TN61 and the latch circuit 25 (inverter circuit 66) is connected to the node N51 of the first amplifying circuit 62. Similarly, the node N62 between the drain terminal of the input transistor TN62 and the latch circuit 65 (inverter circuit 67) is connected to the node N52 of the first amplifying circuit 62.

The second amplifying circuit 63 outputs complementary output signals QOP, QON from the nodes N63, N64.

The common mode detection circuit 64 includes a pair of input transistors TP71, TP72 (third input transistors) for receiving differential input signals DLIP, DLIN. These input transistors TP71, TP72 are MOS transistors that have the same conductivity type as the input transistors TP51, TP52 of the first amplifying circuit 62 described above, i.e., P-channel MOS transistors. The input signals DLIP are applied to the gate terminal (control terminal) of the input transistor TP71, and the input signals DLIN are applied to the gate terminal (control terminal) of the input transistor TP72.

The source terminals (first terminals) of the input transistors TP71, TP72 are connected to each other, and the connection point (node N70) of the source terminals is connected to the drain terminal of a P-channel MOS transistor TP73. The source terminal of the transistor TP73 is connected to a wiring to which a high-potential voltage VDD is supplied (wiring VDD), and the gate terminal of the transistor TP73 is connected to a wiring to which a low-potential voltage VSS is supplied (wiring VSS).

The drain terminals (second terminals) of the input transistors TP71, TP72 are connected to each other, and the connection point (node N71) of the drain terminals is connected to the drain terminal of a N-channel MOS transistor TN71 (fourth transistor). The source terminal of the transistor TN71 is connected to the wiring VSS. The gate terminal and the drain terminal of the transistor TN71 are connected to each other. Furthermore, the voltage at the gate terminal of the transistor TN71 is supplied as the detection voltage VCD to the gate terminals of the transistors TN51, TN52 of the first amplifying circuit 62.

In this common mode detection circuit 64, the electric properties of the input transistors TP71, TP72 are the same as the electric properties of the input transistors TP51, TP52 of the first amplifying circuit 62. Furthermore, the electric properties of the transistor TP73 are the same as the electric properties of the transistor TP53. Furthermore, the electric properties of the transistor TN71 are the same as the electric properties of the transistors TN51, TN52.

Functions of the receiving circuit 61 according to the present embodiment are described.

Note that the basic operations of the first amplifying circuit 62 and the second amplifying circuit 63 relevant to the differential input signals DLIP, DLIN are the same as those of the first amplifying circuit 22 and the second amplifying circuit 23 according to the second embodiment, and therefore descriptions thereof are omitted.

The common mode detection circuit 64 is a replica circuit of the first amplifying circuit 62. In the common mode detection circuit 64, the input transistors TP71, TP72 that receive the differential input signals DLIP, DLIN are connected to each other in parallel. Therefore, the voltage of the node N71 to which the drain terminals of the input transistors TP71, TP72 are connected, changes according to the intermediate voltage of the differential input signals DLIP, DLIN, i.e., according to the common mode voltage Vcm. The voltage of this node N71 is supplied, as the detection voltage VCD, to the gate terminals of the transistors TN51, TN52 of the first amplifying circuit 62. That is to say, the common mode detection circuit 64 generates a detection voltage VCD according to the common mode voltage Vcm of the differential input signals DLIP, DLIN, and controls the transistors TN51, TN52 of the first amplifying circuit 62.

1. When common mode voltage Vcm is sufficiently high.

The input transistors TP71, TP72 of the common mode detection circuit 64 are turned off based on the differential input signals DLIP, DLIN. That is to say, the common mode detection circuit 64 does not operate. At this time, the source-gate voltage Vgs of the transistors TN51, TN52 of the first amplifying circuit 62 becomes approximately the threshold voltage Vthn of the transistors TN51, TN52, and a current does not flow to the transistors TN51, TN52. Therefore, because the first amplifying circuit 62 does not operate, the receiving circuit 61 uses the second amplifying circuit 63 to output complementary output signals QOP, QON according to the result of comparing the differential input signals DLIP, DLIN.

2. When common mode voltage Vcm is sufficiently low.

The input transistors TP71, TP72 of the common mode detection circuit 64 sets the potential (detection voltage VCD) of the node N71 to be greater than or equal to the threshold voltage Vthn of the transistor TN71, according to the differential input signals DLIP, DLIN. By this detection voltage VCD, the transistors TN51, TN52 of the first amplifying circuit 62 are turned on, and the first amplifying circuit 62 operates.

At this time, in the second amplifying circuit 63, the input transistors TN61, TN62 that receive the differential input signals DLIP, DLIN are turned off.

Therefore, a level according to the first amplifying circuit 62 is maintained by the latch circuit 65. Accordingly, the receiving circuit 61 outputs complementary output signals QOP, QON according to the result of comparing the differential input signals DLIP, DLIN.

3. When common mode voltage Vcm is intermediate level.

The input transistors TP71, TP72 of the common mode detection circuit 64 set the potential (detection voltage VCD) of the node N71 to be greater than or equal to the threshold voltage Vthn of the transistor TN71, according to the differential input signals DLIP, DLIN. By this detection voltage VCD, the transistors TN51, TN52 of the first amplifying circuit 62 are turned on, and the first amplifying circuit 62 operates.

Then, in the second amplifying circuit 63, the input transistors TN61, TN62 that receive the differential input signals DLIP, DLIN are turned on and off according to the differential input signals DLIP, DLIN.

Therefore, a level according to the first amplifying circuit 62 and the second amplifying circuit 63 is maintained by the latch circuit 65. Accordingly, the receiving circuit 61 outputs complementary output signals QOP, QON according to the result of comparing the differential input signals DLIP, DLIN.

As described above, according to the present embodiment, the following effects are achieved.

(3-1) The same effects as (1-1) through (1-3) of the first embodiment are achieved.

(3-2) When the differential input signals DLIP, DLIN are sufficiently high, the input transistors TP71, TP72 are turned off, and the common mode detection circuit 64 does not operate. At this time, the source-gate voltage Vgs of the transistors TN51, TN52 of the first amplifying circuit 62 becomes approximately the threshold voltage Vthn, and the transistors TN51, TN52 are cut off. Therefore, the receiving circuit 61 is able to operate at high speed by the second amplifying circuit 63.

(3-3) Furthermore, when the differential input signals DLIP, DLIN are an intermediate level or a low level, the common mode detection circuit 64 supplies, to the gate terminals of the transistors TN51, TN52 of the first amplifying circuit 62, a detection voltage VCD that is higher than the threshold voltage Vthn of the transistors TN51, TN52. The transistors TN51, TN52 are turned on in response to the detection voltage VCD. Therefore, when the latch circuit 65 is reset, a current flows from the wiring VDD to the wiring VSS, via the transistors TP63, TN63, TN51. At this time, the high-potential voltage VDD is to be a potential by which the transistor TN63 may be turned on. Therefore, the high-potential voltage VDD may be low. That is to say, operation is possible at a low high-potential voltage VDD.

Modification Example of Third Embodiment

The third embodiment described above may be implemented by the following mode that has been appropriately changed.

Figure 9:
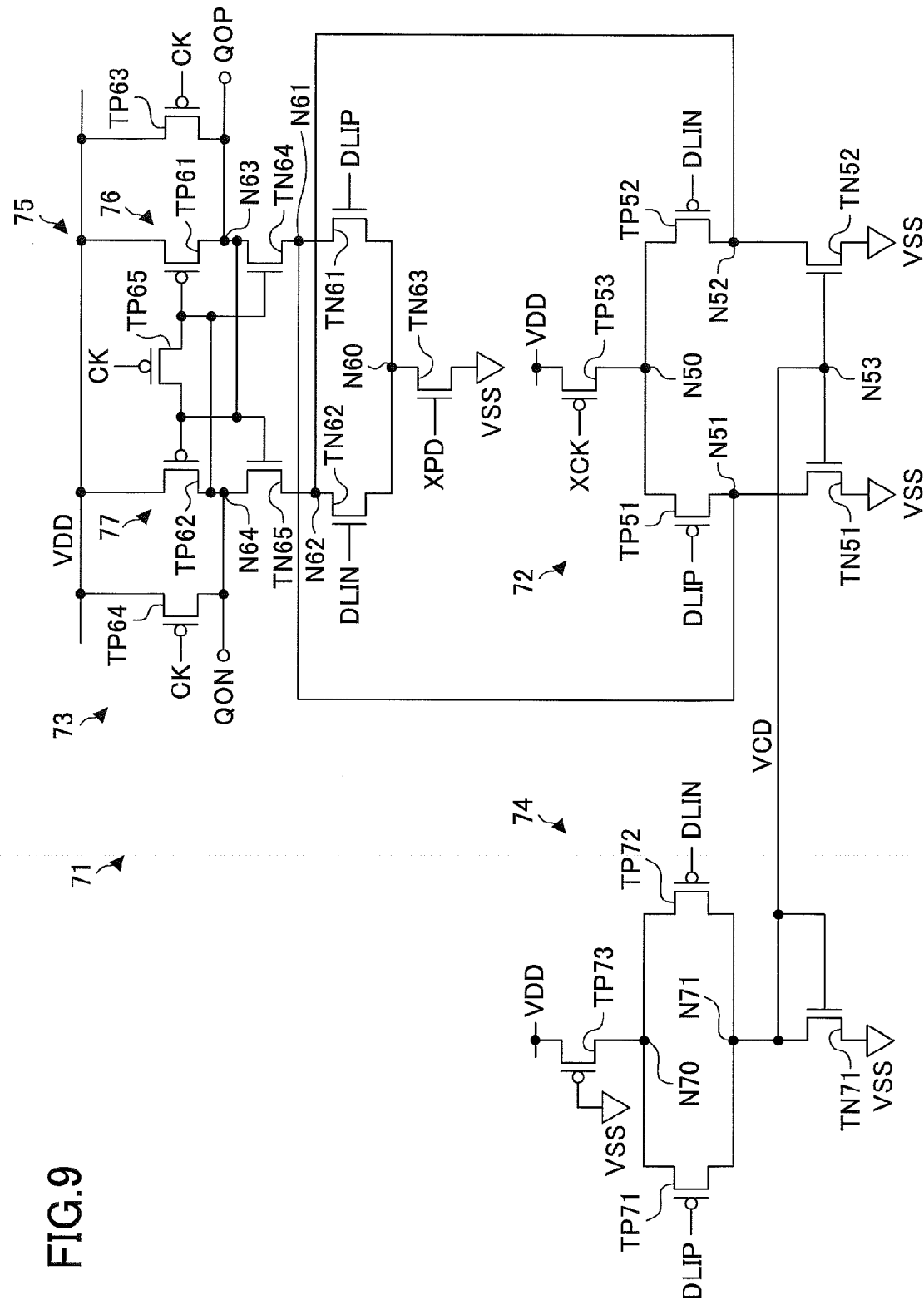
FIG. 9 is a circuit diagram of a modification example of the third embodiment.

As illustrated in FIG. 9, a receiving circuit 71 includes a first amplifying circuit 72, a second amplifying circuit 73, and a common mode detection circuit 74. Similar to the first amplifying circuit 62, the first amplifying circuit 72 includes the transistors TP51 through TP53, TN51, TN52. The connections at the respective terminals are the same as those of the first amplifying circuit 62 described above. Similar to the second amplifying circuit 63 described above, the second amplifying circuit 73 includes the transistors TP61 through TP65, TN61 through TN65. Furthermore, similar to the second amplifying circuit 63 described above, the second amplifying circuit 73 includes a latch circuit 75 (inverter circuits 76, 77). Furthermore, in the second amplifying circuit 73, control signals XPD are applied to the gate terminal of the transistor TN63. Similar to the common mode detection circuit 64 described above, the common mode detection circuit 74 includes the input transistors TP71, TP72, and the transistors TP73, TN71. The connections at the respective terminals are the same as those of the common mode detection circuit 64 described above.

Other Embodiments

The embodiments described above may be implemented by the following modes.

The above embodiments may be implemented by interchanging the P-channel MOS transistors and the N-channel MOS transistors. For example, in the first amplifying circuit, an N-channel MOS transistor may be the input transistor, and in the second amplifying circuit, a P-channel MOS transistor may be the input transistor. In this case, it is obvious that the high-potential voltage VDD and the low-potential voltage VSS may be interchanged and supplied.

In the above third embodiment and the modification of the third embodiment, the electric properties of the transistors TP71 through TP73, TN71 of the common mode detection circuit 64, 74 may be values that are proportionate to the electric properties of the transistors TP51 through TP53, TN51, TN52 of the first amplifying circuit 62, 72, respectively.

According to an aspect of the embodiments, power consumption may be reduced.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A receiving circuit comprising:
a pair of first input transistors of a first conductivity type respectively including control terminals to which differential input signals are applied;
a pair of load transistors of a second conductivity type different from that of the pair of first input transistors, the pair of load transistors respectively being connected between a first wiring to which a first voltage is supplied and first terminals of the pair of first input transistors;
a pair of second input transistors of the second conductivity type respectively including control terminals to which the differential input signals are applied;
a latch circuit connected between a second wiring to which a second voltage is supplied and first terminals of the pair of second input transistors; and
a pair of conversion transistors of the second conductivity type respectively being connected in parallel to the pair of second input transistors, the pair of conversion transistors respectively including control terminals that are respectively connected to a pair of output nodes to which the pair of first input transistors and the pair of load transistors are connected.

2. The receiving circuit according to claim 1, wherein a voltage of the pair of output nodes is set such that the pair of conversion transistors operate in a saturated region when the pair of first input transistors operate according to the differential input signals.

3. The receiving circuit according to claim 1, wherein
one output node is connected to the control terminal of one conversion transistor of the pair of conversion transistors that is connected in parallel to one second input transistor of the pair of second input transistors including the control terminal to which negative-phase input signals having a negative phase with respect to the differential input signals are applied, the one output node being connected to one first input transistor of the pair of first input transistors including the control terminal to which positive-phase input signals having a positive phase with respect to the differential input signals are applied and one load transistor of the pair of load transistors, and
another output node is connected to the control terminal of another conversion transistor of the pair of conversion transistors that is connected in parallel to another second input transistor of the pair of second input transistors including the control terminal to which positive-phase input signals having a positive phase with respect to the differential input signals are applied, the other output node being connected to another first input transistor of the pair of first input transistors including the control terminal to which negative-phase input signals having a negative phase with respect to the differential input signals are applied and another load transistor of the pair of load transistors.

4. A receiving circuit comprising:
a pair of first input transistors of a first conductivity type respectively including control terminals to which differential input signals are applied;
a pair of load transistors of a second conductivity type different from that of the pair of first input transistors, the pair of load transistors respectively being connected between a first wiring to which a first voltage is supplied and first terminals of the pair of first input transistors;
a pair of second input transistors of the second conductivity type respectively including control terminals to which the differential input signals are applied; and
a latch circuit connected between a second wiring to which a second voltage is supplied and first terminals of the pair of second input transistors, wherein
a node, to which the pair of second input transistors and the latch circuit are connected, is connected to a node, to which the pair of first input transistors and the pair of load transistors are connected.

5. The receiving circuit according to claim 4, wherein
a threshold voltage of the pair of load transistors is lower than a threshold voltage of the pair of second input transistors.

6. The receiving circuit according to claim 4, wherein
one output node is connected to a node to which one second input transistor of the pair of second input transistors and the latch circuit are connected, the one second input transistor including the control terminal to which positive-phase input signals having a positive phase with respect to the differential input signals are applied, the one output node being connected to one first input transistor of the pair of first input transistors including the control terminal to which positive-phase input signals having a positive phase with respect to the differential input signals are applied and one load transistor of the pair of load transistors, and
another output node is connected to a node to which another second input transistor of the pair of second input transistors and the latch circuit are connected, the other second input transistor including the control terminal to which negative-phase input signals having a negative phase with respect to the differential input signals are applied, the other output node being connected to another first input transistor of the pair of first input transistors including the control terminal to which negative-phase input signals having a negative phase with respect to the differential input signals are applied and another load transistor of the pair of load transistors.

7. The receiving circuit according to claim 1, further comprising:
a detection circuit connected to control terminals of the pair of load transistors, the detection circuit being configured to supply, to the control terminals of the pair of load transistors, a control voltage according to a common mode voltage of the differential input signals.

8. The receiving circuit according to claim 7, wherein
the detection circuit includes
a pair of third input transistors of the first conductivity type that are connected to each other in parallel, the pair of third input transistors respectively including control terminals to which the differential input signals are applied, and
a fourth input transistor of the second conductivity type connected between a connection point and the first wiring, the connection point being between the pair of third input transistors, the fourth input transistor including a control terminal connected to the connection point, wherein the control voltage is output from a node to which the pair of third input transistors and the fourth transistor are connected.

\* \* \* \* \*